(12) United States Patent
Hu et al.

(10) Patent No.: US 9,609,772 B2
(45) Date of Patent: Mar. 28, 2017

(54) MOLDED CASING, MOLD ASSEMBLY AND FORMING METHOD

(71) Applicant: HTC Corporation, Taoyuan (TW)

(72) Inventors: Chih-Kai Hu, Taoyuan County (TW); Yu-Jing Liao, Taoyuan County (TW); I-Cheng Chuang, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 15/086,070

(22) Filed: Mar. 31, 2016

(65) Prior Publication Data

US 2016/0212870 A1 Jul. 21, 2016

Related U.S. Application Data

(62) Division of application No. 13/863,389, filed on Apr. 16, 2013, now Pat. No. 9,346,198.

(51) Int. Cl.
| | |
|---|---|
| *H05K 5/03* | (2006.01) |
| *A45C 5/02* | (2006.01) |
| *H05K 5/02* | (2006.01) |
| *B29C 43/02* | (2006.01) |
| *B29C 33/42* | (2006.01) |
| *G06F 1/16* | (2006.01) |
| *B29L 31/34* | (2006.01) |

(52) U.S. Cl.
CPC ........... *H05K 5/0243* (2013.01); *B29C 33/42* (2013.01); *B29C 43/02* (2013.01); *B29C 43/021* (2013.01); *G06F 1/1626* (2013.01); *G06F 1/1656* (2013.01); *B29C 2043/022* (2013.01); *B29L 2031/3481* (2013.01)

(58) Field of Classification Search
CPC .................. H05K 5/0243; B29C 33/42; B29L 2031/3481
USPC .................................................. 206/320, 521
See application file for complete search history.

(56) References Cited

U.S. PATENT DOCUMENTS

| | | | |
|---|---|---|---|
| 8,342,325 B2 * | 1/2013 | Rayner ................. | G06F 1/1626 206/305 |
| 9,295,174 B2 * | 3/2016 | Witter ...................... | H05K 5/03 |

(Continued)

FOREIGN PATENT DOCUMENTS

| | | |
|---|---|---|
| CN | 2081809 | 7/1991 |
| CN | 201499406 | 6/2010 |

OTHER PUBLICATIONS

"Office Action of China Counterpart Application", issued on May 31, 2016, p. 1-p. 10.

(Continued)

*Primary Examiner* — Joseph S Del Sole
*Assistant Examiner* — Thukhanh T Nguyen
(74) *Attorney, Agent, or Firm* — Jianq Chyun IP Office

(57) ABSTRACT

A molded casing suitable for a handheld electronic device is provided. The handheld electronic device includes a body and the molded casing, and at least one part of the body is covered with the molded casing. The molded casing is in a uniform thickness and has a continuous mosaic surface. The mosaic surface is composed of a plurality of non-coplanar polygons, wherein an intersection line is formed between any two adjacent polygons. An end of any one of the intersection lines is connected to an end of another intersection line or an edge of the mosaic surface.

5 Claims, 4 Drawing Sheets

(56) References Cited

U.S. PATENT DOCUMENTS

2006/0255493 A1* 11/2006 Fouladpour ............. B29C 51/10
                                                            264/161
2008/0251975 A1   10/2008 Gallagher et al.
2010/0096284 A1*  4/2010  Bau ........................ B65D 85/00
                                                            206/320

OTHER PUBLICATIONS

"Office Action of China Counterpart Application", issued on Nov. 17, 2016, p. 1-p. 6.

* cited by examiner

MOLDED CASING, MOLD ASSEMBLY AND FORMING METHOD

CROSS-REFERENCE TO RELATED APPLICATION

This application is a divisional application of and claims the priority benefit of application Ser. No. 13/863,389, filed on Apr. 16, 2013, now allowed. The entirety of the above-mentioned patent applications is hereby incorporated by reference herein and made a part of this specification.

FIELD OF THE INVENTION

The disclosure generally relates to a molded casing and the manufacturing technique thereof. More particularly, the disclosure relates to a molded casing having a polygonal mosaic surface and the manufacturing technique thereof.

DESCRIPTION OF RELATED ART

Manufacture of a molded casing usually adopts injection molding technology to inject elastic material into a mold, such that the surface structure of the mold is molded on a surface of the formed component, so as to facilitate fast and mass production.

To form the surface structure of the mold, the conventional methods usually use the cutting tool of the machine tool to form the surface of the mold, or use the discharging electrodes of the electrical discharge machining to melt the surface of the mold, so as to form the structure described above on the surface of the mold.

However, the mold integrally formed by the methods described above is hard to provide an ideally molded structure due to manufacture limit of manufacturing apparatus or precision limit of trimming surfaces of the cutting tool. Specifically, in manufacture of the molded casing having a polygonal mosaic surface, it is known that the mold is hard to form a structure with sharp edges, such that the crest lines and the valley lines of the mosaic surface of the molded casing formed by the mold would have round corners, and fail to meet the appearance requirement.

SUMMARY OF THE INVENTION

The present disclosure provides a molded casing having a mosaic surface composed of a plurality of polygons, and an equivalent radius of a vertex angle at each intersection line of the mosaic surface is close to zero, such that the mosaic surface of the molded casing has a plurality of sharp crest lines and valley lines, and meet the appearance requirement.

According to one embodiment of the present disclosure, the molded casing is suitable for a handheld electronic device, wherein the handheld electronic device includes a body and the molded casing, and at least one part of the body is covered with the molded casing. The molded casing is in a uniform thickness. The molded casing has a mosaic surface, which is a continuous surface. The mosaic surface is composed of a plurality of non-coplanar polygons, wherein an intersection line is formed between any two adjacent polygons. An end of any one of the intersection lines is connected to an end of another intersection line or an edge of the mosaic surface.

To make the above features and advantages of the present disclosure more comprehensible, several embodiments accompanied with drawings are described in detail as follows.

DESCRIPTION OF EMBODIMENTS

Figure 1A:
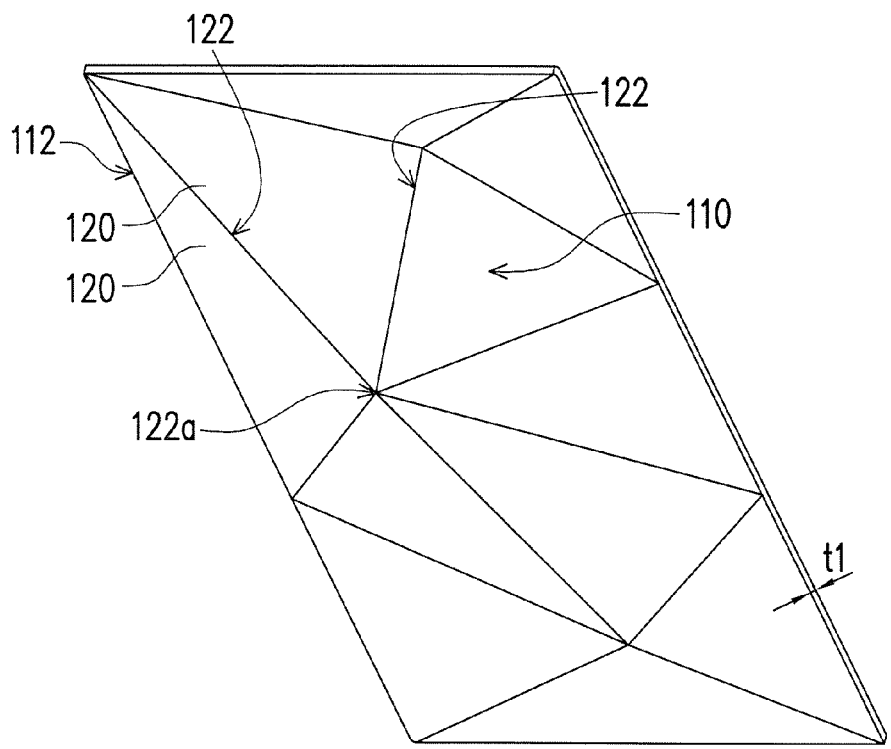
FIG. 1A illustrates a perspective view of a front side of a molded casing according to one embodiment of the present disclosure.
Figure 1B:
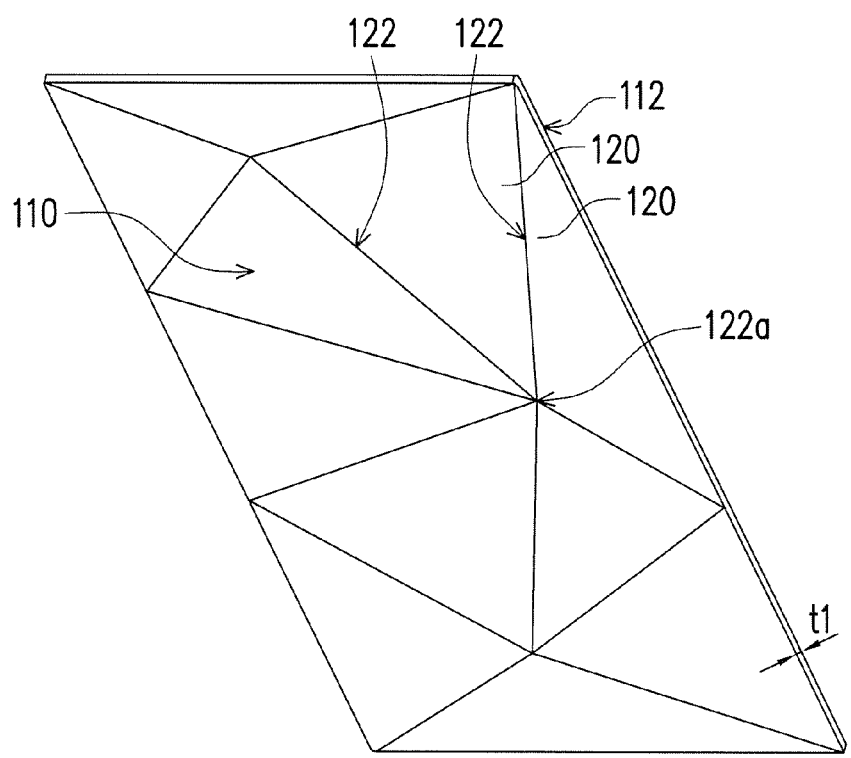
FIG. 1B illustrates a perspective view of a back side of the molded casing in FIG. 1A.

FIG. 1A illustrates a perspective view of a front side of a molded casing according to one embodiment of the present disclosure. FIG. 1B illustrates a perspective view of a back side of the molded casing in FIG. 1A. Referring to FIG. 1 and FIG. 2, the molded casing 100 of the present embodiment is in a uniform thickness t1, and the front surface of the molded casing 100 is a mosaic surface 110, which is a continuous surface. The mosaic surface 110 is composed of a plurality of non-coplanar polygons 120, and an intersection line 122 is formed between any two adjacent polygons 120. Each of the intersection lines 122 may be a crest line or a valley line according to the included angle between the surfaces of the two adjacent polygons 120. In addition, the lengths of the adjacent sides of any two adjacent polygons 120 are equal. Therefore, an end 122a of any one of the intersection lines 122 on the mosaic surface 110 is connected to an end 122a of another intersection line 122 or an edge 112 of the mosaic surface 110.

The polygons 120 composing the mosaic surface 110 may be triangles as shown in FIG. 1A, or other polygons such as quadrangle, hexagon, etc. Furthermore, the mosaic surface 110 may be composed of one type of polygons, for example, triangles, as shown in FIG. 1A, or composed of at least two types of polygons. On the other hand, in the present embodiment, an equivalent radius of a vertex angle at each intersection line 122 may be set to be less than or equal to 0.1 millimeter, so as to form the sharp crest lines and valley lines on the molded casing. The molded casing 100 is applicable to all kinds of products such as handheld electronic device, so as to meet the requirement of molding and appearance, and be able to provide special visual effect.

Figure 2A:
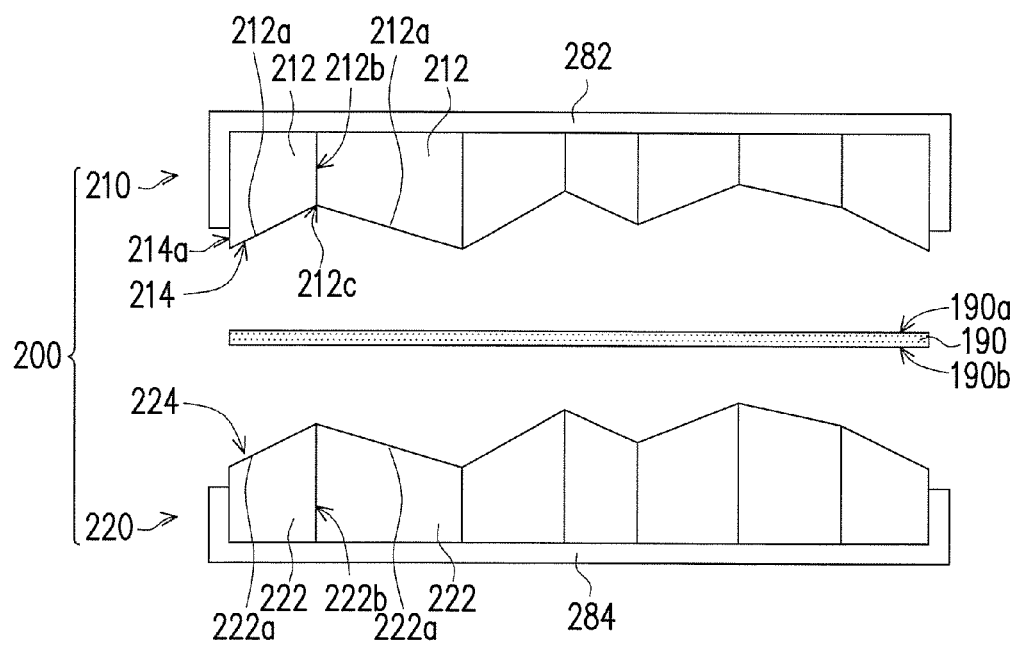
FIG. 2A and FIG. 2B illustrate a process of molding a plate by a mold assembly to form a molded casing.
Figure 2B:
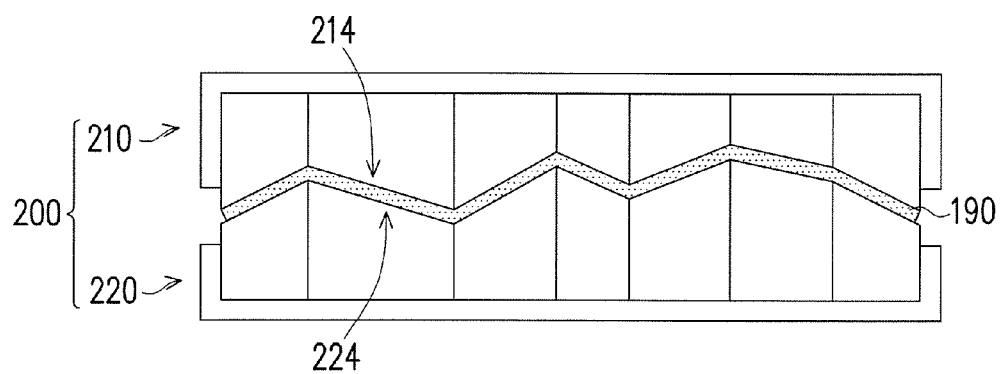

The present disclosure further provides a method for forming the molded casing 100 described above. FIG. 2A and FIG. 2B illustrate a process of molding a plate 190 by a mold assembly 200 to form the molded casing 100. Firstly, as shown in FIG. 2A, in the present embodiment, the mold assembly 200 includes a first mold 210 and a second mold 220, wherein the first mold 210 and the second mold 220 respectively have a first mosaic tooling surface 214 and a second mosaic tooling surface 224 corresponding to the mosaic surface 110 of the molded casing 100 described above, wherein the first mosaic tooling surface 214 and the second mosaic tooling surface 224 are opposite to each other and the shapes thereof are complementary to each other.

In the present embodiment, a plate 190 with uniform thickness is disposed between the first mosaic tooling surface 214 of the first mold 210 and the second mosaic tooling surface 224 of the second mold 220, and then the first mold 210 and the second mold 220 are compressed to mold the plate 190, wherein contours of the first mosaic tooling surface 214 and the second mosaic tooling surface 224 are respectively molded on the first surface 190a and the second surface 190b of the plate 190, so as to form the molded casing 100 having the mosaic surface 110 described above. Afterward, the formed molded casing 100 is taken out of the mold assembly 200.

In the present embodiment, the plate 190 may be heated during the compressing process described above to speed up the molding of the plate 190. Herein, the temperature range of the heating process performed on the plate 190 may be determined according to the material of the plate 190 and other manufacturing conditions. In the present embodiment, the material of plate 190 may be, for example, glass, plastic, metal, etc., and may be heated to a transition temperature, wherein the range of the transition temperature is from 800° C. to 860° C. or from 500° C. to 900° C.

In consideration of the conventional integrally-formed mold hard to provide the ideally molded structure, the structure of the first mold 210 and the second mold 220 are improved in the present embodiment, so as to provide the molded structure with sharp edges, so the mosaic surface 110 of the molded casing 100 has sharp intersection lines 122.

Figure 3:
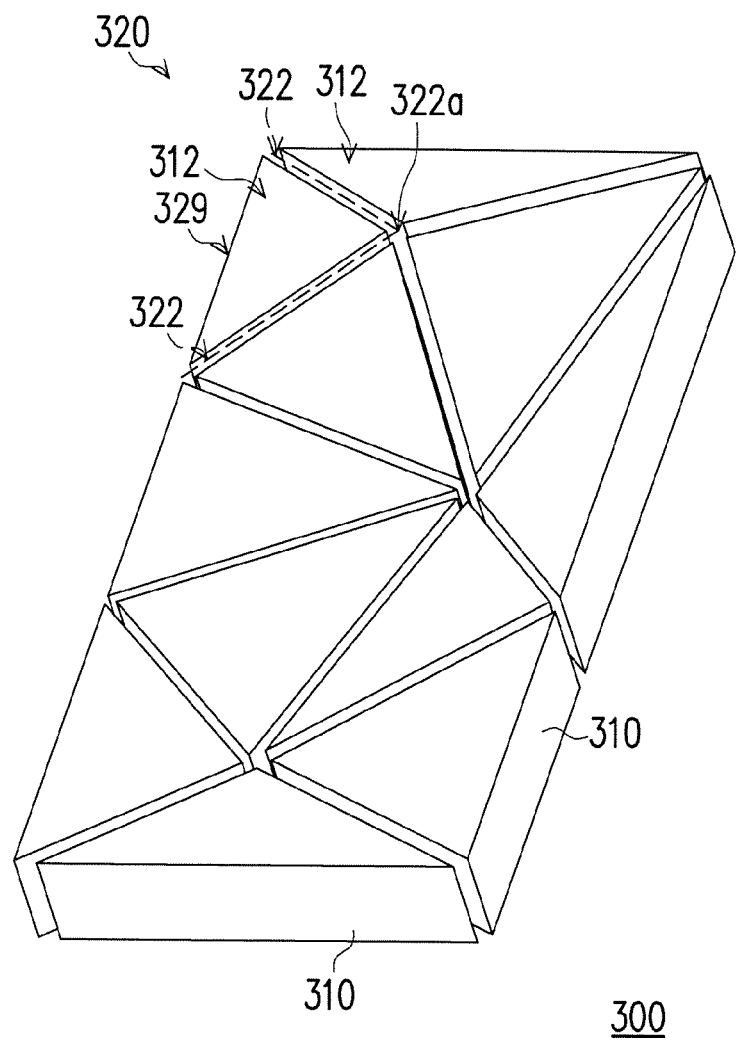
FIG. 3 illustrates a mold structure according to one embodiment of the present disclosure.

FIG. 3 illustrates a mold structure 300 according to one embodiment of the present disclosure, which may be the first mold 210 or the second mold 220 in FIG. 2A and FIG. 2B. The mold structure includes a plurality of composition units 310, and each of the composition units 310 has a surface 312 in polygonal shape, for example, triangular, quadrilateral or other polygonal shape. The composition units 310 are arranged in parallel and adjacent to each other, such that the surfaces 312 of the composition units 310 form a mosaic tooling surface 320, which is a continuous surface. Accordingly, a plurality of intersection lines 322 are formed between any two adjacent surfaces 312 on the mosaic tooling surface 320, and the lengths of the adjacent sides of any two adjacent surfaces 312 are equal, such that an end 322a of any one of the intersection lines 322 is connected to an end 322a of another intersection line 322 or an edge 329 of the mosaic tooling surface 320.

The mold structure 300 is composed of a plurality of mutually-independent composition units 310, such that the polygonal surfaces 312 between any two adjacent composition units 310 are able to precisely aligned and tightly connected to each other, so as to form the mosaic tooling surface 320, and the formed mosaic tooling surface 320 has sharp intersection lines 322.

In the present embodiment, the first mold 210 may adopt the design of the mold structure 300 described above. Namely, the first mold 210 may include multiple first composition units 212 arranged in parallel on a first base 282. Each of the first composition units 212 has a first surface 212a, which is in polygonal shape, and the first composition units 212 are disposed adjacent to each other, and the first surfaces 212a tightly lean against to each other to form a first mosaic tooling surface 214, which is a continuous surface. A first intersection line 212b is formed between any two adjacent first surfaces 212a, and an end 212c of any one of the first intersection lines 212b is connected to an end 212c of another first intersection line 212b or an edge 214a of the first mosaic tooling surface 214. Therefore, the first mosaic tooling surface 214 may have sharp first intersection lines 212b. After the process shown in FIG. 2A and FIG. 2B, the contour of the first mosaic tooling surface 214 is molded on the first surface 190a of the plate, so as to form the mosaic surface 110 of the molded casing 100 described above.

Figure 4:
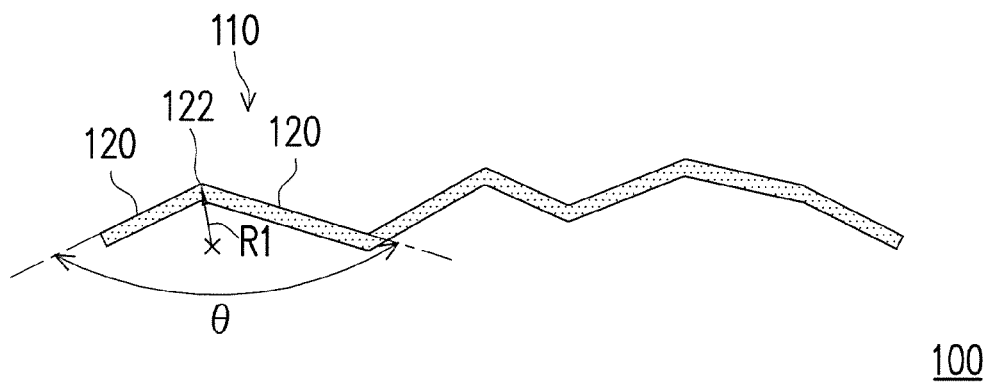
FIG. 4 further illustrates a cross-sectional view of a molded casing taken out of the mold assembly in FIG. 2B.

FIG. 4 further illustrates a cross-sectional view of the molded casing 100 taken out of the mold assembly 200 shown in FIG. 2B. Referring to FIG. 4, the mosaic surface 110 of the molded casing 100 formed by the first mold 210 having the first mosaic tooling surface 214 with sharp first intersection lines 212b would have sharp intersection lines 122 corresponding to the first intersection lines 212b. To be more specific, an equivalent radius R1 of a vertex angle θ at each intersection line 122 may be less than or equal to 0.1 millimeter, or even close to zero, which is in no-rounded-angle condition.

On the other hand, FIG. 2A and FIG. 2B show that the second mold 220 is located at a back side of the plate 190. Herein, the second mold 220 may adopt the conventional design, which the second mold 220 is integrally formed, or other method to form the second mosaic tooling surface 224, or may also adopt the design of the mold structure 300 in FIG. 3 to form the second mosaic tooling surface 224 by a plurality of composition units. As shown in FIG. 2A and FIG. 2B, the second mold 220 includes multiple second composition units 222 arranged in parallel on a second base 284. Each of the second composition units 222 has a second surface 222a, which is in polygonal shape, and the second composition units 222 are disposed adjacent to each other, such that the second surfaces 222a form the second mosaic tooling surface 224.

Furthermore, in another embodiment, a second mosaic tooling surface 224 composed of a plurality of second surfaces 222a may be, for example, a plane surface. For instance, the first mosaic tooling surface 214 of the present embodiment may be molded on the first surface 190a of the plate 190 to be a primary appearance surface, and the second mosaic tooling surface 224 may be molded on the second surface 190b of the plate 190 to be a secondary appearance surface. Therefore, the present disclosure does not limit the second mosaic tooling surface 224 to a plane surface or a surface complementary to the first mosaic tooling surface 214, users may choose the manufacturing method of the second mosaic tooling surface 224 according to actual demands of products.

Figure 5:
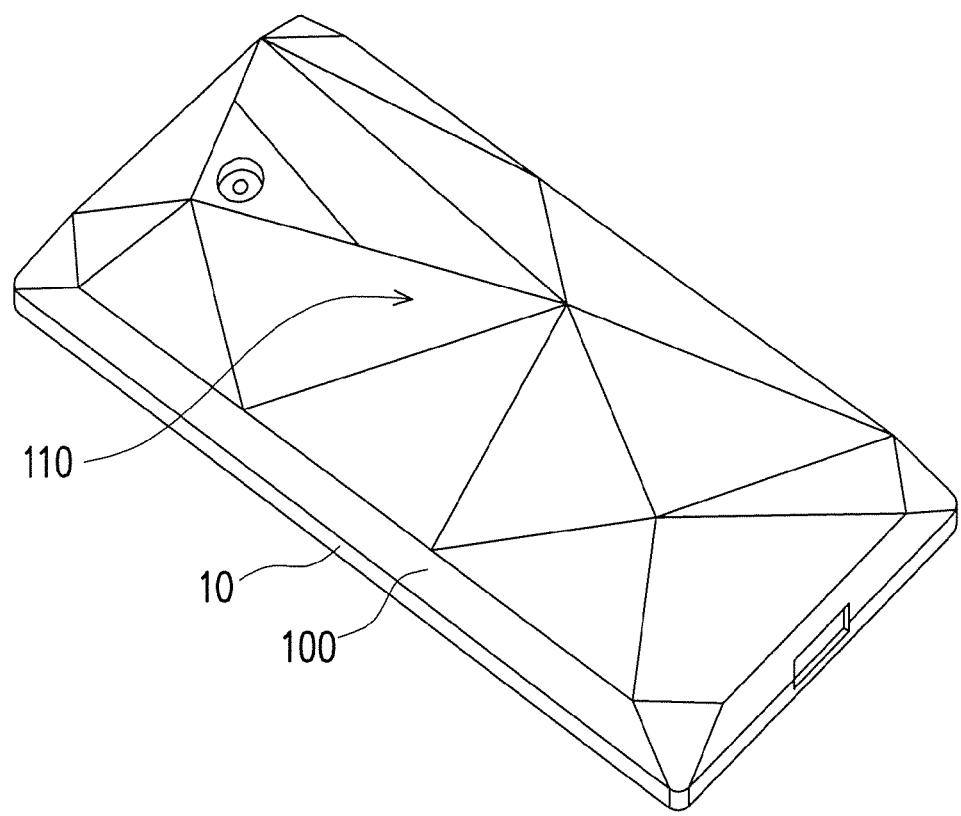
FIG. 5 illustrates an example of a handheld electronic device adopting the molded casing of the present disclosure as a back cover.

FIG. 5 illustrates an example of a handheld electronic device adopting the molded casing of the present disclosure as a back cover. Referring to FIG. 5, a handheld electronic device 1 includes a body 10 and the molded casing 100 covering the back side of the body 10 as a back cover. Due to the equivalent radius R1 of the vertex angle θ, as shown in FIG. 4, at each intersection line 122 on the molded casing 100 close to zero, the mosaic surface 110 having sharp crest lines and valley lines can be formed to meet the special requirement of molding and appearance, and be able to provide special visual effect.

Of course, the present disclosure does not limit the applications of the molded casing 100, which may be applied to other types of products, for example, outer casings or decoration panels of electronic products such as laptops, displays, etc., or home appliances and so on.

In sum, the mold assembly of the present disclosure uses a plurality of mutually-independent composition units to form the mold, such that the polygonal surfaces between any two adjacent composition units are able to precisely aligned and tightly connected to each other to form the mosaic tooling surface. Therefore, the mosaic tooling surface has comparatively sharp intersection lines. Thereby, the molded casing formed by the mold assembly can have the mosaic surface with sharp crest lines and sharp valley lines, so as to meet the requirement for molding and appearance, and be able to provide special visual effect.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A molded casing, suitable for a handheld electronic device, wherein the handheld electronic device comprises a body and the molded casing, at least one part of the body is covered with the molded casing, wherein the molded casing is in a uniform thickness, and has a continuous mosaic surface, the mosaic surface is composed of a plurality of non-coplanar polygons, an intersection line is formed between any two adjacent polygons, and an end of any one of the intersection lines is connected to an end of another intersection line or an edge of the mosaic surface.

2. The molded casing as claimed in claim 1, wherein each of the polygons comprises triangle or quadrangle.

3. The molded casing as claimed in claim 1, wherein the molded casing is a back cover of the handheld electronic device.

4. The molded casing as claimed in claim 1, wherein an equivalence radius of a vertex angle at each intersection line is less than or equal to 0.1 millimeter.

5. The molded casing as claimed in claim 1, wherein any two adjacent polygons of the mosaic surface are plane and oriented in different directions from each other.

* * * * *